US006445188B1

(12) United States Patent
Lutz et al.

(10) Patent No.: US 6,445,188 B1
(45) Date of Patent: Sep. 3, 2002

(54) INTELLIGENT, SELF-MONITORING AC POWER PLUG

(76) Inventors: Tony Lutz, P.O. Box 2252, Ketchum, ID (US) 83340; Guy Hansen, P.O. Box 894, Ketchum, ID (US) 83340; Mike Harney, P.O. Box 1556, Layton, UT (US) 84041

( * ) Notice: Subject to any disclaimer, the term of this patent is extended or adjusted under 35 U.S.C. 154(b) by 0 days.

(21) Appl. No.: 09/560,667

(22) Filed: Apr. 27, 2000

Related U.S. Application Data

(60) Provisional application No. 60/131,314, filed on Apr. 27, 1999.

(51) Int. Cl.[7] .................. G01R 31/00; G01R 31/14; G01R 11/32; G01R 11/63
(52) U.S. Cl. .................. 324/508; 324/509; 324/510; 324/511; 324/103 R; 324/142
(58) Field of Search ................. 324/508, 509, 324/510, 511, 103 R, 114, 142, 157

(56) References Cited

U.S. PATENT DOCUMENTS

| | | | |
|---|---|---|---|
| 4,150,333 A | 4/1979 | Edwards et al. ............ 324/186 |
| 4,652,139 A | 3/1987 | Sulcer, Jr. ...................... 368/9 |
| 4,920,549 A | 4/1990 | Dinovo ........................ 377/16 |
| 5,315,236 A | 5/1994 | Lee ............................. 324/157 |
| 5,811,966 A | * 9/1998 | Lee ............................. 324/116 |
| 5,869,960 A | * 2/1999 | Brand ......................... 324/142 |
| 5,900,804 A | * 5/1999 | Yewell .................. 324/508 X |
| 5,933,004 A | * 8/1999 | Jackson et al. ............. 324/142 |

* cited by examiner

Primary Examiner—N. Le
Assistant Examiner—Wasseem H. Hamdan
(74) Attorney, Agent, or Firm—Pedersen & Co., PLLC; Ken J. Pedersen; Barbara S. Pedersen

(57) ABSTRACT

Disclosed is an electronic circuit assembled onto a miniature printed circuit board and assembled into an AC plug body such that the AC mains connect to terminals on or connected to the printed circuit board. The circuit contains a filtered power supply, microcontroller, and external interface, such that the plug may be connected to a special interface connector in order for data to be exchanged with a PC or computer or other programmer/reader device. A current sensor is employed and a voltage sensor is also employed. From the combined readings from the voltage sensor and the current sensor, the embedded program running on the microcontroller can determine the power being consumed by the loading device.

20 Claims, 6 Drawing Sheets

INTELLIGENT, SELF-MONITORING AC POWER PLUG

DESCRIPTION

This application is a conversion of, and claims priority from, our prior, co-pending U.S. Provisional Application No. 60/131,314 filed Apr. 27, 1999, similarly entitled, and incorporated herein by reference.

BACKGROUND OF THE INVENTION

1. Field of the Invention

Embodiments of the present invention relate in general to a system for the monitoring of AC power sources and loads. More specifically, the present invention relates to a self-contained, in-line electrical plug for monitoring/storing data relating to source and load use or abuse for electric tools and appliances, for later transfer and analysis of the data.

As an introduction to the problems solved by the present invention, it is desirable for various reasons to know the status of an AC power source or of a piece of equipment that is connected as a load to an AC power source. Numerous power-monitoring inventions are available which connect externally between the power source and load. However, none of the monitoring inventions that are known to exist have the features of the present invention. The AC power monitoring device of the present invention is unique in that the entire electronic circuit is self-contained within a universal AC plug body, being of any type of conventional plug used for 115 volt, 230 volt or other AC voltages. It will become clear from the descriptions that follow that this invention is useful and novel.

2. Related Art

The inventor has identified several prior art references in the U.S. patent art. U.S. Pat. No. 4,652,139 by Sulcer describes a non-volatile elapsed-time meter. U.S. Pat. No. 4,920,549 by Dinovo describes a means for collecting data about the accumulated run-time and average cycle-time of a switched circuit, typically for tracking equipment run-time. These devices do not record voltage spikes, surges, brief dropouts or other perturbations of the supply line. These devices only record the accumulated time that a supply of power was detected as being present. In addition, Dinovo's invention also calculates and stores the average on-time of a piece of equipment.

U.S. Pat. No. 5,315,236 by Lee is a monitor that measures the instantaneous power and total accumulated energy consumed by a device. It is a device that plugs into an electric socket and has a separate receptacle for an appliance plug. Lee's invention is dissimilar to the present invention in that the device is not built into a plug-body and it lacks certain monitoring capabilities that are incorporated into the present invention.

Still, there is a need for a convenient, compact in-line plug that can be used to monitor total usage of equipment such as a tool/appliance as well as the details of use or abuse of the equipment. An in-line plug is needed that can be supplied along with, for example, rented equipment to allow the owner of the equipment to plan maintenance or replacement. Such a plug is needed to allow the equipment owner to know the treatment of his equipment away from his possession, for improved budgeting, billing, maintenance supervision, etc.

SUMMARY OF THE INVENTION

Accordingly, in the present invention, an electronic circuit is assembled onto a miniature printed circuit board and assembled into an AC plug body such that the AC mains connect to terminals on or connected to the printed circuit board. The circuit contains a filtered power supply, microcontroller, and external interface, such that the plug may be connected to a special interface connector in order for data to be exchanged with a PC or computer or other programmer/reader device. The reader or PC interface also allows for erasure of a non-volatile EEPROM and for networking of several plug devices to a central reader which facilitates the networking of appliances. A current sensor is employed, preferably a differential type sensor such as a differential Hall Effect sensor. Alternatively, other current sensors may also be used, such as a magnetic pick-up (clamp) device with current sensing inductors that are located such that they are parallel to the two power leads. The inductors may form a differential current sensor which is immune to electromagnetic noise. Or, a low resistance connected in series in the hot or neutral line, with measurement of voltage across the resistance, may also be used. A voltage sensor is also employed. From the combined readings from the voltage sensors and the current sensor, the embedded program running on the microcontroller can determine the power being consumed by the loading device.

In one embodiment of the invention, the circuit contains a real-time clock and RAM memory, both of which are powered by a back-up battery. With these features, it is possible to store real-time information, such as the occurrence of peak loads or voltage spikes, for example. Information regarding the intensity and duration of other undesirable or anomolous events, both elapsed-time and real-time, can be time-stamped and stored in the battery-backed RAM memory.

In another embodiment, non-volatile memory, such as EEPROM memory, may be used without the need of a battery. Such an embodiment would not be capable of affixing real-time time-stamps to detected events, but only elapsed time-stamps, beginning when the equipment being monitored was plugged-in for that particular period of use.

In another embodiment, the invention incorporates a ground-fault detection circuit, such that hazardous or undesirable ground currents will cause a circuit interrupter to trip, disconnecting the load from the power source and preventing damage to equipment or electric shock. A fault test push-button switch and a fault reset push-button switch enable the user to test and/or reset the circuit interrupting device.

These and other embodiments, aspects, advantages and features of the present invention will be set forth in part in the description, and in part will come to be understood by those skilled in the art by reference to the following description of the invention and referenced drawings, or by practice of the invention.

BRIEF DESCRIPTION OF THE DRAWINGS

FIG. 3b is a more detailed schematic diagram of the microcontroller depicted in FIG. 3a.

DESCRIPTION OF THE PREFERRED EMBODIMENTS

Figure 1A:
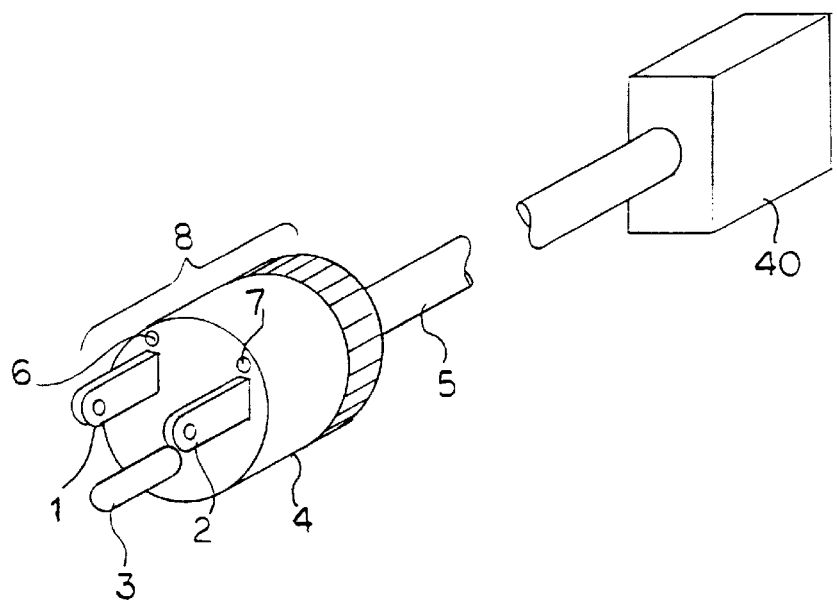
FIG. 1a is a perspective view of an embodiment of the invention showing the monitoring plug installed onto an existing power cord.

Referring now to the figures, FIG. 1a is a perspective view of an embodiment showing the monitoring plug which is installed onto an existing power cord.

Figure 1B:
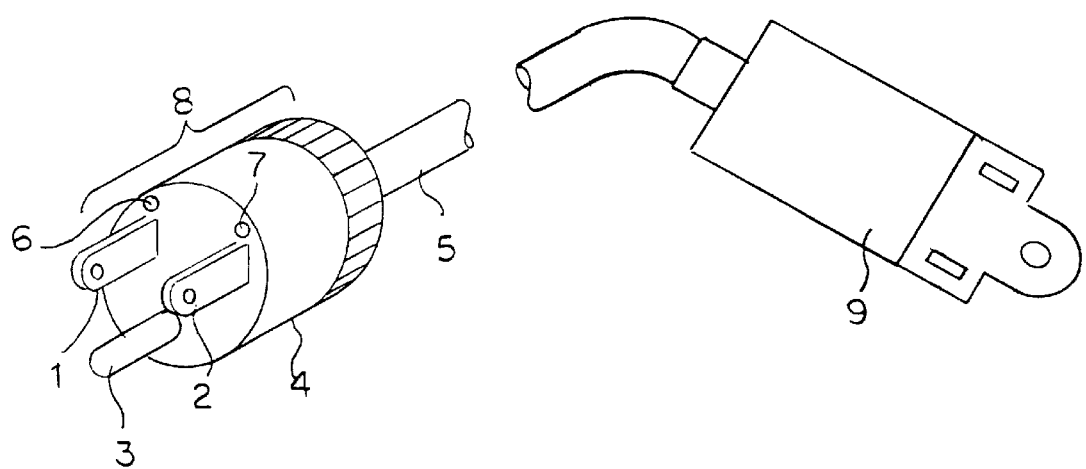
FIG. 1b is a perspective view of another embodiment of the invention showing the monitoring plug incorporated into a universal power cord.
Figure 2:
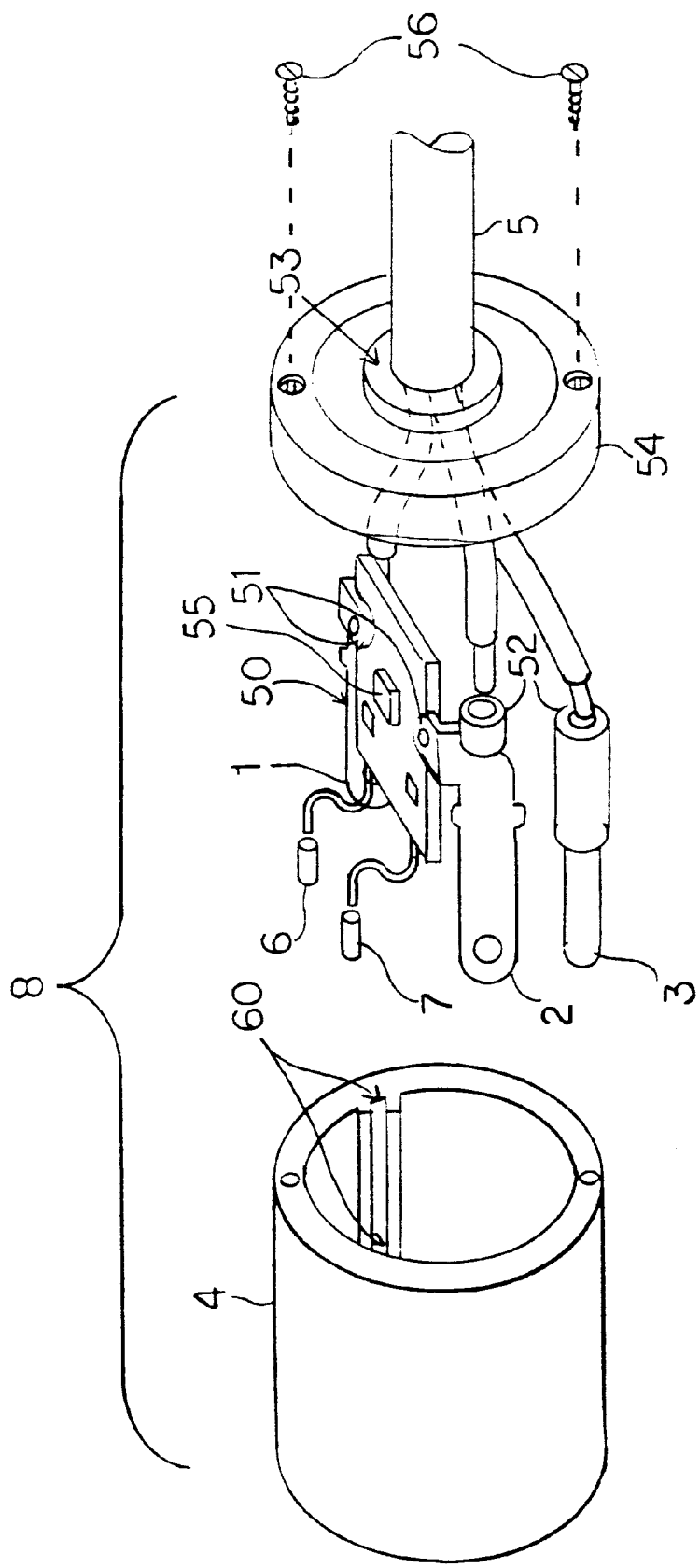
FIG. 2 is a partial exploded view of the monitoring plug circuit assembly and case assembly of the embodiments depicted in FIGS. 1a and 1b.

Cord 5 connects plug 8 to any type of equipment which may be considered a load 40, for example, a grinder, sander, saw, or a rotodrill. FIG. 1b is a plan view of an embodiment showing the monitoring plug incorporated into a universal power cord. Installed within the plug body 4 is the monitoring plug circuit assembly, as shown in FIG. 2. In this embodiment, two connector pins 6 and 7 are received into plug body 4. Two or more such connector pins may be used. Terminating resistors may be connected to these connector pins and to ground to allow for proper networking to a PC or computer or other reader device. These connections are used to connect an external reader interface shown as item 21 in FIG. 3 to the monitoring plug 8, whereby plug 8 data can be transferred and analyzed. Also, these connector pins allow for erasure of the non-volatile memory in the microcontroller.

FIG. 2 illustrates the preferred monitoring plug circuit assembly and case assembly. The standard 3-prong type plug contacts, including Hot 1, Neutral 2, and Ground 3 are shown. Inside the plug body 4, these contacts are connected via a transformer to printed circuit assembly 50 at solder tabs 51, and are also connected to the power cord 5 at swage points 52. Printed circuit assembly 50 is mounted onto slots 60 inside the plug body 4. Cover 54 incorporates strain relief ring 53 and is attached by screws 56, or other suitable fastening means, including solvent welding or ultrasonic welding. A controlling integrated circuit chip 55 and other electronic components are mounted onto the printed circuit assembly 50.

Figure 3A:
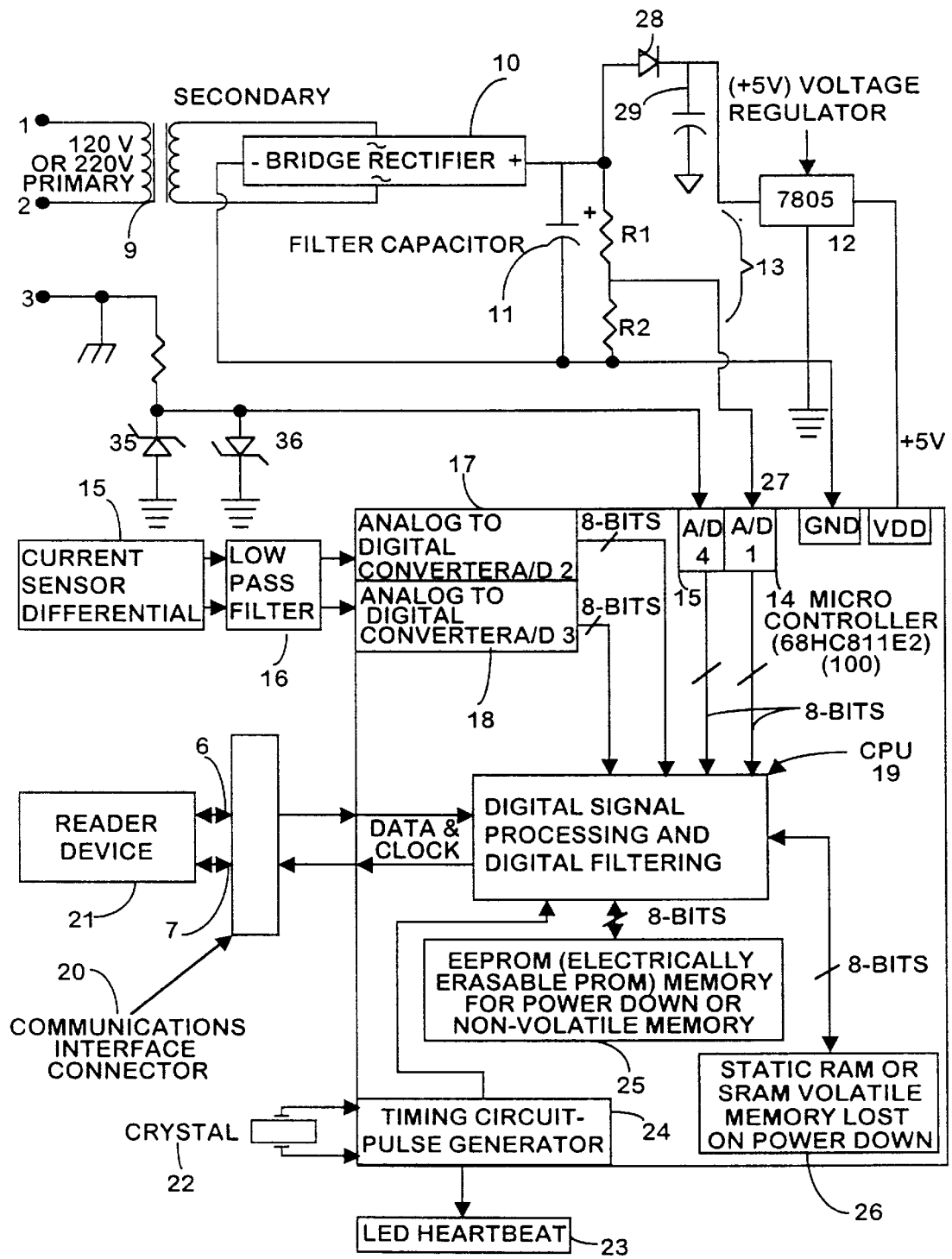
FIG. 3a is a schematic block diagram of one embodiment of the monitoring plug circuit of the invention.
Figure 3B:
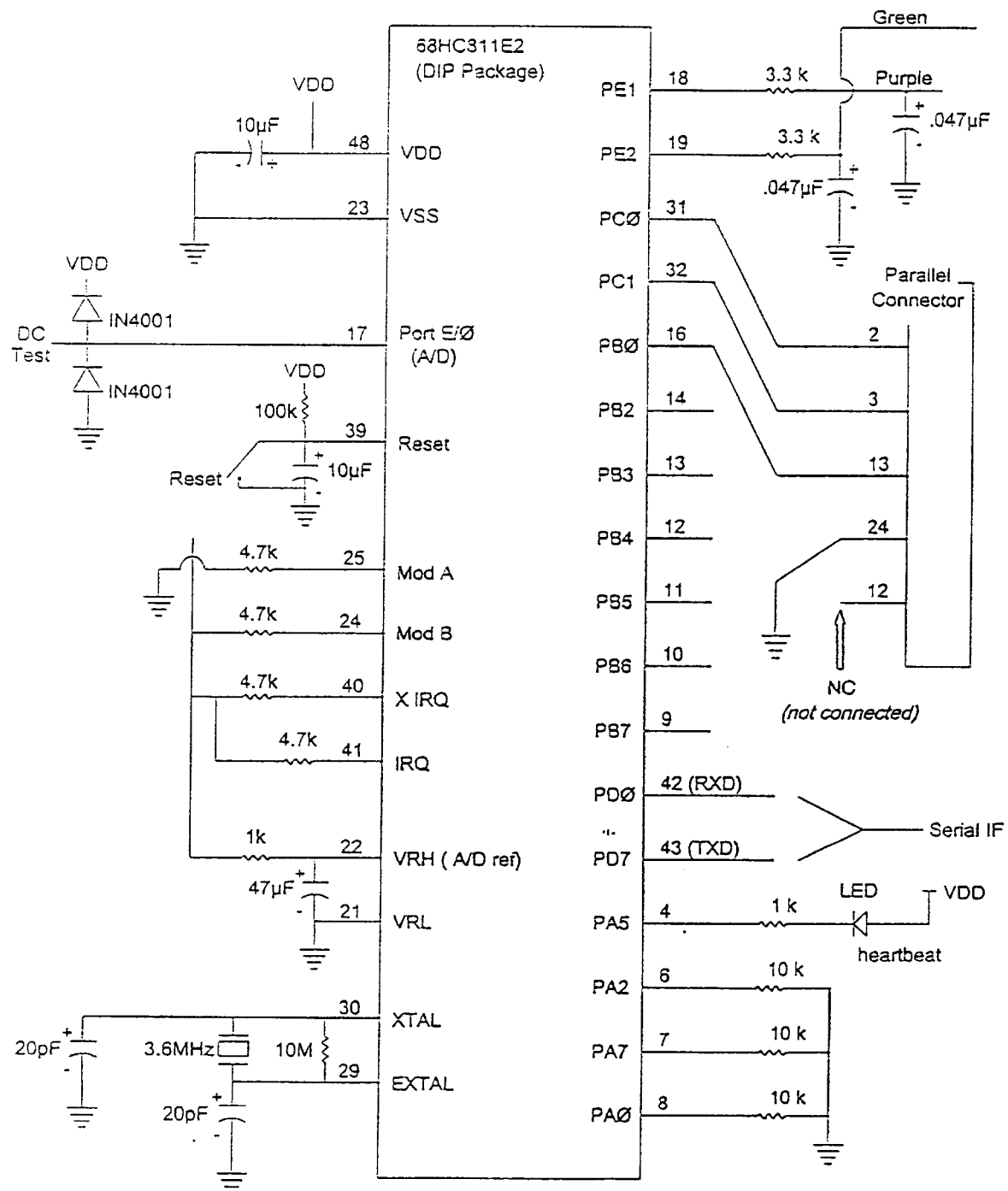

FIG. 3 is a schematic block diagram of the preferred plug circuit. The Hot 1 and Neutral 2 power leads connect to transformer 9, which supplies reduced secondary voltage to bridge rectifier 10. Capacitor 11 filters the full-wave rectified voltage, which passes through blocking diode 28 to supply voltage regulator 12, which in-turn supplies microcontroller 100 with +5 volts or slightly more. The power supply ground 27 is the common point for termination of the minusside of the power supply and the ground connections of the microcontroller and associated circuits on the printed circuit assembly 50. Capacitor 29 stores energy such that, in the event of a power sag or failure, or removal of the plug from AC, the printed circuit assembly 50 is still supplied with operating voltage through regulator 12. Capacitor energy is prevented from leaking back through the power supply lead by blocking diode 28. Such a feature can be used for power-down detection, whereby the embedded software of the microprocessor would monitor the voltage level via analog-to-digital converter 14, and upon sensing that the power was not present, could execute a housekeeping subroutine to store away critical data before capacitor 29 was depleted.

A varying DC voltage, which is proportional to the AC line voltage, is sensed at voltage divider 13 and connected into the analog-to-digital (A/D) converter 14. Schottky diodes 35, 36 are present to protect from under voltage or over voltage being present at the A/D input. A/D converter 14 convert the ground and voltage sense signal into digital numbers at a sampling rate determined by internal software and by the clock rate of the microcontroller 100. The clock rate is determined by piezoelectric crystal 22 and timing circuit 24. An optional LED 23 blinks to show that the timing circuit is functional, thereby showing that power is present to the circuit as well.

Current sensor 15 is connected to microcontroller 100 by way of low-pass filter 16 and A/D converters 17, 18.

Figure 4:
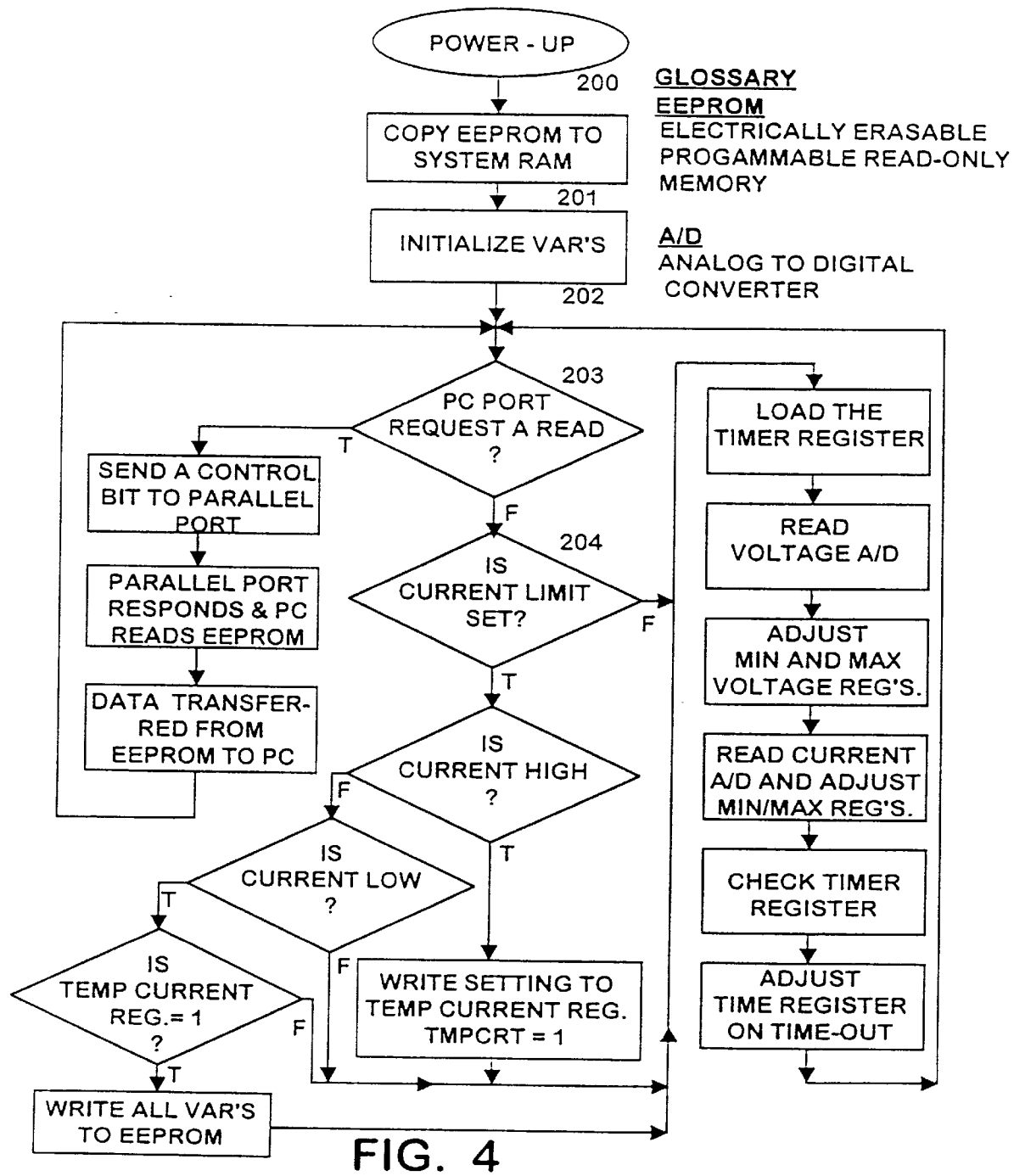
FIG. 4 depicts a software flowchart of one embodiment of the embedded program of the monitoring plug circuit of the invention.

FIG. 4, which is self-explanatory, illustrates the preferred software flowchart of the embedded plug circuit program.

Figure 5:
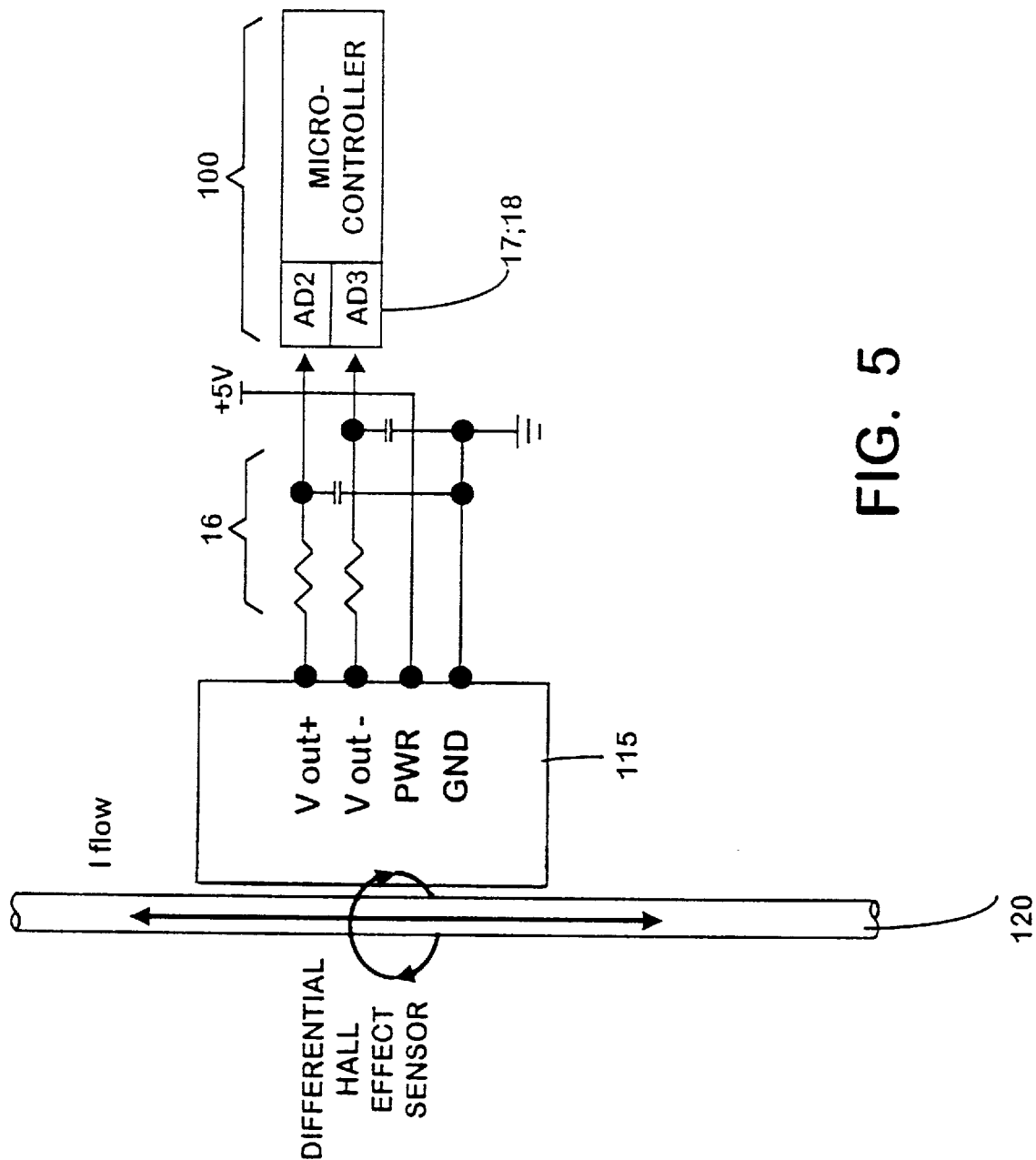
FIG. 5 is a schematic diagram of details of one embodiment of the current sensor portion of the circuit.

FIG. 5 is a schematic diagram of details of the current sensor portion of the circuit. Current sensor 115 is a solid-state, differential type of sensor. It is placed adjacent to Hot conductor 120, which generates a magnetic field 121 that is proportional to current-flow and orthogonal to the conductor. Sensor 115 senses the magnetic force and converts it into a differential output. Low-pass filter components 16 attenuate the high-frequency components of the differential signals, which are then fed into A/D converters 17, 18. The digital data received from the A/D's is processed by the controller and stored in the controller's non-volatile memory (EEPROM)(25 in FIG. 3). Also, the microcontroller's on-chip SRAM (26 in FIG. 3) helps in controller processing and to load controller code from the EEPROM (25) on power up. So the EEPROM serves the function of storing code (which gets loaded to SRAM after power up), and storing data from the A/Ds during operation.

A potentially cheaper way to measure current is to use a low resistance connected in series in the hot or neutral line, and measure the voltage across the resistance.

Resistors can be purchased as low as 0.0005 ohms. Since the power supply is AC power, one needs to find the peak voltage across the resistor. The peak voltage times 0.7071 divided by the resistance gives the current. For inductive loads like motors, this will only be approximate, although the relative change will be fairly accurate. So, for detecting misuse and for measuring hours of use, voltage measurement across the resistance should be adequate.

Depending upon the microprocessor's A/D sampling rate, one may be able to find the voltage peak directly. If not, the low-level voltage will have to be amplified in order to pump up a capacitor where a DC voltage can be measured. Still, resistors and op-amps are generic and are probably cheaper than custom inductors, so this approach may be less expensive than the magnetic field approach discussed above. Also, the resistor in the hot or neutral line could be eliminated by using a trace on the PC board which the hot or neutral current passes through. The resistance of this trace could be calibrated at the factory to increase accuracy. This would eliminate the resistor cost for further savings.

We claim:

1. A microprocessor-controlled, self-monitoring AC power plug comprising:
   an AC power plug body; and
   a printed circuit board contained within the AC power plug body and having AC
   main lines connected to the board, said printed circuit board containing:
   a. a microcontroller;
   b. a power supply connected to the AC main lines for supplying power from the AC main lines to said microcontroller;
   c. an external interface, such that said power plug may be connected to an interface connector for data from said power plug to be exchanged with a computer;

d. a current sensor;

e. a voltage sensor;

wherein measurements from the current sensor and voltage sensor are used by a program on the microcontroller to determine the power being consumed through the power plug.

2. The power plug of claim 1 which further comprises a real-time clock, RAM memory, and a battery that powers said real-time clock and said RAM memory.

3. The power plug of claim 1 which also comprises a non-volatile memory.

4. The power plug of claim 1 which also comprises a ground-fault detection circuit.

5. A power plug as in claim 4, wherein said ground-fault detection circuit comprises a circuit interrupter for preventing damage to equipment being powered by said power plug, and wherein the power plug comprises a test and reset switch for testing and resetting said circuit interrupter.

6. A power plug as in claim 1, wherein said power supply comprises a bridge rectifier connected to said AC main lines and a voltage regulator for supplying a reduced and rectified voltage to said microcontroller.

7. A power plug as in claim 1, wherein said current sensor is a differential sensor.

8. A power plug as in claim 7, wherein said differential sensor is a differential Hall Effect sensor.

9. A power plug as in claim 1, wherein said current sensor is a magnetic pick-up device with current sensing inductors located parallel to said AC main lines.

10. A power plug as in claim 1, which also comprises a real-time clock, RAM memory, and a battery that powers said real-time clock and said RAM memory, wherein measurements from the current sensor and voltage sensor are used by said program on the microcontroller to determine peak load and voltage spike information, and said peak load and voltage spike information is stored in said RAM memory.

11. A microprocessor-controlled, self-monitoring AC power plug comprising:

an AC power plug body; and a printed circuit board contained within the AC power plug body and having AC main lines connected to the board, said printed circuit board containing:

a. a microcontroller;

b. a power supply connected to the AC main lines for supplying power from the AC main lines to said microcontroller;

c. an external interface, such that said power plug may be connected to an interface connector for data from said power plug to be exchanged with a reader device;

d. a current sensor;

e. a voltage sensor;

wherein measurements from the current sensor and voltage sensor are used by a program on the microcontroller to determine the power being consumed through the power plug.

12. The power plug of claim 11 which also comprises a real-time clock, RAM memory, and a battery that powers said real-time clock and said RAM memory.

13. The power plug of claim 11 which also comprises a non-volatile memory.

14. The power plug of claim 11 which also comprises a ground-fault detection circuit.

15. A power plug as in claim 14, wherein said ground-fault detection circuit comprises a circuit interrupter for preventing damage to equipment being powered by said power plug, and wherein the power plug comprises a test and reset switch for testing and resetting said circuit interrupter.

16. A power plug as in claim 11, wherein said power supply comprises a bridge rectifier connected to said AC main lines and a voltage regulator for supplying a reduced and rectified voltage to said microcontroller.

17. A power plug as in claim 11, wherein said current sensor is a differential sensor.

18. A power plug as in claim 17, wherein said differential sensor is a differential Hall Effect sensor.

19. A power plug as in claim 11, wherein said current sensor is a magnetic pick-up device with current sensing inductors located parallel to said AC main lines.

20. A power plug as in claim 11, which also comprises a real-time clock, RAM memory, and a battery that powers said real-time clock and said RAM memory, wherein measurements from the current sensor and voltage sensor are used by said program on the microcontroller to determine peak load and voltage spike information, and said peak load and voltage spike information is stored in said RAM memory.

* * * * *